(12) United States Patent
Kimura et al.

(10) Patent No.: US 7,903,426 B2
(45) Date of Patent: Mar. 8, 2011

(54) MULTILAYER ELECTRONIC COMPONENT, ELECTRONIC DEVICE, AND METHOD FOR PRODUCING MULTILAYER ELECTRONIC COMPONENT

(75) Inventors: Masahiro Kimura, Ogaki (JP); Yoshifumi Saito, Otsu (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 118 days.

(21) Appl. No.: 11/836,988

(22) Filed: Aug. 10, 2007

(65) Prior Publication Data

US 2007/0278670 A1    Dec. 6, 2007

Related U.S. Application Data

(63) Continuation of application No. PCT/JP2006/320304, filed on Oct. 11, 2006.

(30) Foreign Application Priority Data

Oct. 26, 2005  (JP) ................................. 2005-311351

(51) Int. Cl.
    *H05K 7/00*    (2006.01)
(52) U.S. Cl. .......................... 361/760; 257/693; 257/697
(58) Field of Classification Search .......... 361/760–763, 361/792–795; 174/260–266; 257/773, 690, 257/692, 693, 697
    See application file for complete search history.

(56) References Cited

U.S. PATENT DOCUMENTS

| | | | |
|---|---|---|---|
| 4,753,694 A | 6/1988 | Herron et al. | |
| 4,771,537 A | 9/1988 | Pryor et al. | |
| 5,570,274 A * | 10/1996 | Saito et al. | 361/784 |
| 5,628,919 A | 5/1997 | Tomura et al. | |
| 5,909,058 A | 6/1999 | Yano et al. | |
| 6,207,550 B1 | 3/2001 | Hase et al. | |
| 7,640,655 B2 * | 1/2010 | Sunohara | 29/832 |
| 2002/0084513 A1 * | 7/2002 | Siniaguine | 257/621 |
| 2003/0071350 A1 | 4/2003 | Takehara et al. | |
| 2004/0004280 A1 | 1/2004 | Shibata | |
| 2004/0120127 A1 * | 6/2004 | Hirose | 361/760 |
| 2005/0118750 A1 | 6/2005 | Baba et al. | |

FOREIGN PATENT DOCUMENTS

| | | |
|---|---|---|
| GB | 2 415 291 A | 1/2005 |
| JP | 62-166090 A | 7/1987 |
| JP | 1-50119 B2 | 10/1989 |
| JP | 07-202372 A | 8/1995 |

(Continued)

OTHER PUBLICATIONS

Official Communication for PCT Application No. PCT/JP2006/320304; mailed on Nov. 7, 2006.

(Continued)

*Primary Examiner* — David A Zarneke
*Assistant Examiner* — Jenny L Wagner
(74) *Attorney, Agent, or Firm* — Keating & Bennett, LLP (57) ABSTRACT

A multilayer electronic component including a resin layer disposed on a mounting board side is mounted on a mounting board, and has a structure such that, even when deformation, such as deflection and strain, occurs, a stress on the multilayer electronic component is relieved. In the multilayer electronic component, ends of columnar conductors protrude from a main surface of a resin layer facing the outside. The multilayer electronic component is mounted on a mounting board, and the ends of the columnar conductors are electrically connected to conductive lands. In this case, a predetermined gap is formed between the multilayer electronic component and the mounting board.

9 Claims, 6 Drawing Sheets

FOREIGN PATENT DOCUMENTS

| | | |
|---|---|---|
| JP | 07-231050 A | 8/1995 |
| JP | 09-083141 A | 3/1997 |
| JP | 2001-094033 A | 4/2001 |
| JP | 2002-246500 A | 8/2002 |
| JP | 2003-124435 A | 4/2003 |
| JP | 2004-014648 A | 1/2004 |
| JP | 2005-109307 A | 4/2005 |
| JP | 2005-223225 A | 8/2005 |
| JP | 2005-235807 A | 9/2005 |
| WO | 03/037050 A1 | 5/2003 |
| WO | 2005/071745 A1 | 8/2005 |

OTHER PUBLICATIONS

Official Communication issued in corresponding European Patent Application No. 06811611.0, mailed on Nov. 26, 2009.

* cited by examiner

MULTILAYER ELECTRONIC COMPONENT, ELECTRONIC DEVICE, AND METHOD FOR PRODUCING MULTILAYER ELECTRONIC COMPONENT

BACKGROUND OF THE INVENTION

1. Field of the Invention

The present invention relates to a multilayer electronic component, an electronic device including the multilayer electronic component, and a method for producing the multilayer electronic component. In particular, the present invention relates to a multilayer electronic component having a multilayer structure including a resin layer disposed on a ceramic substrate, an electronic device including the multilayer electronic component mounted on a mounting board, and a method for producing the multilayer electronic component.

2. Description of the Related Art

For example, Japanese Unexamined Patent Application Publication No. 2004-14648 (Patent Document 1) discloses a structure in which a ceramic substrate is mounted on a mounting board. More specifically, the ceramic substrate includes a columnar conductor composed of a sintered metal, the ceramic substrate and the columnar conductor being formed by co-firing. The columnar conductor protrudes from the ceramic substrate. The columnar conductor is soldered to an electrode disposed on the mounting board side to mount the ceramic substrate on the mounting board.

On the other hand, for example, Japanese Unexamined Patent Application Publication No. 9-83141 (Patent Document 2) discloses a structure in which a semiconductor element is mounted on a multilayer ceramic substrate. More specifically, the multilayer ceramic substrate includes a columnar conductor composed of a sintered metal, the multilayer ceramic substrate and the columnar conductor being formed by co-firing. In the same way as in Patent Document 1, the columnar conductor protrudes from the multilayer ceramic substrate. The columnar conductor is soldered to an electrode disposed on the semiconductor element side to mount the semiconductor element on the multilayer ceramic substrate. The protrusion of the columnar conductor from the multilayer ceramic substrate results in the formation of a gap between the semiconductor element and the multilayer ceramic substrate. Patent Document 2 discloses that the gap is sealed with a resin.

Patent Document 1 also discloses that an electronic component is mounted on a surface of the ceramic substrate facing the mounting board. In this case, the electronic component may be sealed with a resin in order to ensure reliability by improving the environmental resistance of the electronic component.

However, as described in Patent Document 2, when the protrusion of the columnar conductor from the ceramic substrate is sealed with the resin so as to be completely buried in the resin, the resin layer is in contact with the mounting board or is in proximity to the mounting board. Thus, a relatively large stress is applied to the ceramic substrate and the electronic component mounted thereon because of deformation, such as deflection and strain, which possibly appears on the mounting board side. As a result, disadvantageously, the ceramic substrate has a structural defect such as a crack, the electronic component has a structural defect such as a crack, and the electronic component is detached from the ceramic substrate.

SUMMARY OF THE INVENTION

In order to overcome the problems described above, preferred embodiments of the present invention provide a multilayer electronic component having a composite structure including a ceramic substrate and a resin layer, the structure being capable of relieving a stress that may be applied to the multilayer electronic component mounted.

Other preferred embodiments of the present invention provide an electronic device having a structure including the multilayer electronic component mounted on the mounting board.

Further preferred embodiments of the present invention provide a method for producing the multilayer electronic component.

The present invention preferably is applied to a multilayer electronic component including a ceramic substrate and a resin layer disposed on one main surface of the ceramic substrate. To overcome the above-described technical problems, the multilayer electronic component has the following unique structure.

The ceramic substrate includes a surface conductive film positioned at the one main surface and/or a via conductor. the resin layer includes a columnar conductor composed of a sintered metal and arranged such that the axial direction of the columnar conductor lies in the thickness direction of the resin layer, a first end of the columnar conductor in the axial direction reaches at least the interface between the ceramic substrate and the resin layer, the first end is integrated with the surface conductive film and/or the via conductor provided with the ceramic substrate, and a second end opposite the first end of the columnar conductor protrudes from a main surface of the resin layer, the main surface facing the outside.

The columnar conductor may have a flange portion at the intermediate portion of the columnar conductor in the axial direction, the flange portion having a cross-sectional area larger than that of the second end. In this case, the flange portion is arranged so as to be in contact with the main surface of the resin layer, the main surface facing the outside.

The second end of the columnar conductor may have a cross-sectional area larger than that of the intermediate portion of the columnar conductor in the axial direction.

In the multilayer electronic component according to a preferred embodiment of the present invention, preferably, the second end of the columnar conductor protrudes from the main surface of the resin layer facing the outside and has a protrusion height of about 0.01 mm or more.

The multilayer electronic component according to a preferred embodiment of the present invention may further include an electronic subcomponent mounted on the ceramic substrate and incorporated in the resin layer.

The multilayer electronic component according to a preferred embodiment of the present invention may further include an electronic subcomponent mounted on a main surface of the ceramic substrate facing the outside.

Another preferred embodiment of the present invention provides an electronic device including the multilayer electronic component described above and a mounting board upon which the multilayer electronic component is mounted. In the electronic device according to a preferred embodiment of the present invention, the multilayer electronic component is arranged such that the main surface of the resin layer facing the outside faces the mounting board. The second end of the columnar conductor is electrically connected to a conductive connecting portion disposed on the mounting board with a conductive connecting member. A predetermined gap is provided between the multilayer electronic component and the mounting board.

In the electronic device according to a preferred embodiment of the present invention, the conductive connecting member is solder.

Another preferred embodiment of the present invention provides a method for producing the multilayer electronic component. In the method for producing the multilayer electronic component, steps described below are performed.

First, a step of forming a green composite laminate including a green ceramic compact to be formed into a ceramic substrate is performed, the ceramic compact having a conductive portion at a predetermined position of one main surface, and a nonsinterable inorganic material compact containing an inorganic material powder that is not sintered at a sintering temperature of the ceramic compact and including a columnar conductor buried such that the axial direction thereof lies in the thickness direction, and the green ceramic compact and the nonsinterable inorganic material compact being laminated such that the conductive portion is in contact with an end of the columnar conductor.

Next, a step of firing the green composite laminate is performed at a temperature at which the ceramic compact is sintered but the inorganic material compact is not sintered. Thereby, the ceramic compact is sintered to form the ceramic substrate.

Next, a step of removing the nonsinterable inorganic material compact from the sintered composite laminate is performed. Thereby, the ceramic substrate having the columnar conductor protruding from the one main surface is obtained.

Next, a step of forming a resin layer disposed on the one main surface of the ceramic substrate is performed such that the columnar conductor is partially buried in the resin layer and the end of the columnar conductor protrudes.

In a method for producing the multilayer electronic component according to a preferred embodiment of the present invention, the conductive portion at the predetermined position of the one main surface of the green ceramic compact is preferably formed of a via conductor to be formed in the ceramic substrate.

Furthermore, to form the resin layer, the resin layer is preferably formed by transfer molding.

Moreover, a step of mounting an electronic subcomponent on the one main surface of the ceramic substrate may be performed before the step of forming the resin layer.

Furthermore, a step of mounting an electronic subcomponent on the other main surface of the ceramic substrate may be further performed.

According to the multilayer electronic component in accordance with a preferred embodiment of the present invention, the protrusion of the second end of the columnar conductor from the main surface of the resin layer facing the outside results in the formation of the predetermined gap between the multilayer electronic component and the mounting board when the multilayer electronic component is mounted on the mounting board. Thus, when deformation, such as deflection and strain, appears in the mounting board, a stress on the multilayer electronic component is relieved. Hence, the possibility of occurrence of a structural defect such as a crack in the ceramic substrate included in the multilayer electronic component is reduced. Also in the case where an electronic subcomponent is mounted on the ceramic substrate, the possibility of occurrence of a structural defect such as a crack in the electronic subcomponent is reduced. Furthermore, the probability of occurrence of the detachment of the electronic subcomponent is reduced.

According to a preferred embodiment of the present invention, the protrusion of the second end of the columnar conductor allows easy visual checking of the conductive connecting member, such as solder, for electrically connecting the second end to the conductive connecting portion of the mounting board. The use of solder as the conductive connecting member allows easy checking of a solder filet.

According to a preferred embodiment of the present invention, the protrusion of the second end of the columnar conductor allows the application of a sufficient amount of the conductive connecting member along the second end when the multilayer electronic component is mounted on the mounting board. This sufficiently increases the strength, i.e., tensile strength and shear strength, of the mounting structure in which the multilayer electronic component is mounted on the mounting board.

According to the multilayer electronic component in accordance with a preferred embodiment of the present invention, the columnar conductor has the flange portion at the intermediate portion of the columnar conductor in the axial direction, and the flange portion has a cross-sectional area larger than that of the second end and is located so as to be in contact with the main surface of the resin layer facing the outside. In this case, this structure, in the mounting state, allows the conductive connecting member such as solder for connecting the second end of the columnar conductor to the conductive connecting portion disposed on the mounting board to thicken at both ends in the axial direction, thereby increasing the reliability of the electrical connection between the columnar conductor and the conductive connecting portion disposed on the mounting board.

According to the multilayer electronic component in accordance with a preferred embodiment of the present invention, the second end of the columnar conductor has a cross-sectional area larger than that of the intermediate portion of the columnar conductor in the axial direction. In this case, when an electronic subcomponent is incorporated in the resin layer, the contact area between the columnar conductor and the conductive connecting portion disposed on the mounting board is increased while the mounting area for the electronic subcomponent incorporated is ensured by thinning the columnar conductor in the resin layer, thereby improving the reliability of the electrical connection. Furthermore, tensile strength and shear strength are sufficiently increased.

According to the multilayer electronic component in accordance with a preferred embodiment of the present invention, the second end of the columnar conductor protrudes from the main surface of the resin layer facing the outside and has a protrusion height of about 0.01 mm or more. In this case, in the mounting state, a stress applied from the mounting board is more reliably relieved.

According to the method in accordance with a preferred embodiment of the present invention for producing the multilayer electronic component, the resin layer is formed on the one main surface of the ceramic substrate such that an end of the columnar conductor protrudes. Thus, the step of forming the resin layer is easily performed compared with, for example, the case in which the resin layer is formed so as to have the same thickness as the protrusion height of the columnar conductor. When the resin layer is formed so as to have the same thickness as the protrusion height of the columnar conductor, unfortunately, the end of the columnar conductor may be covered with the resin. In this case, it is necessary to polish the surface of the resin layer to allow the columnar conductor to protrude from the resin layer.

According to the method in accordance with a preferred embodiment of the present invention for producing the multilayer electronic component, the conductive portion at the predetermined position of the one main surface of the green ceramic compact is formed of a via conductor to be formed in the ceramic substrate. In this case, this structure increases the reliability of the electrical connection at the interface between the ceramic substrate and the resin layer and increases mechanical strength.

According to the method in accordance with a preferred embodiment of the present invention for producing the multilayer electronic component, the resin layer is formed by transfer molding. In this case, the resin layer having satisfactorily surface flatness is easily formed by flattening a surface of a die in contact with the surface of the resin layer. The columnar conductor is composed of a sintered metal. Thus, it is relatively difficult to maintain the dimension of the columnar conductor in the axial direction at constant with satisfactory reproducibility because of the influence of firing conditions and the like. Hence, when the resin layer is formed so as to have the same thickness as the protrusion height of the columnar conductor, it is difficult to reliably expose the entire end surface of the columnar conductor. In various preferred embodiments of the present invention, since the resin layer may be formed such that the end of the columnar conductor protrudes, transfer molding is used to form the resin layer without problems.

Other features, elements, steps, characteristics and advantages of the present invention will become more apparent from the following detailed description of preferred embodiments of the present invention with reference to the attached drawings.

DETAILED DESCRIPTION OF PREFERRED EMBODIMENTS

Figure 1:
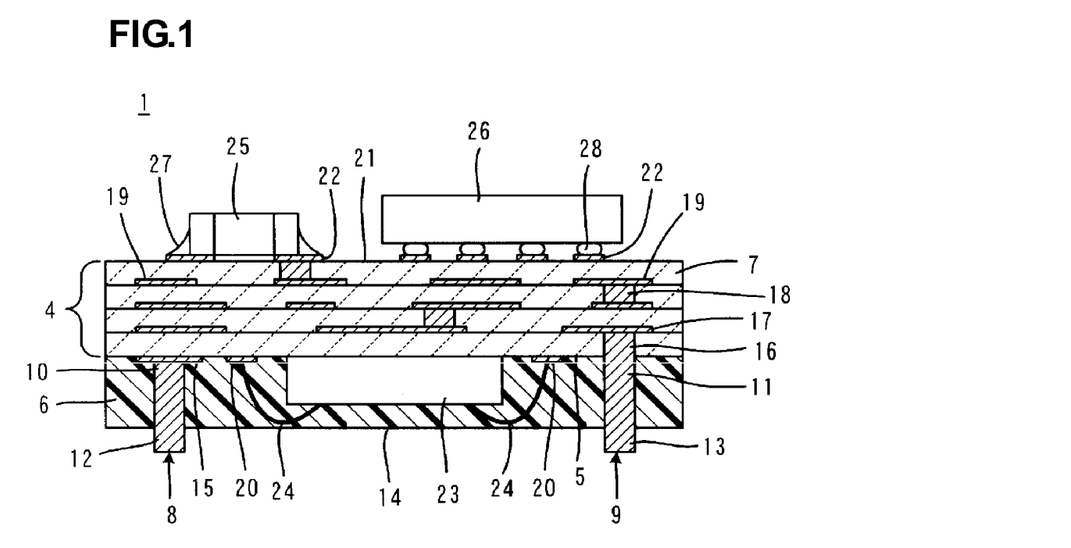
FIG. 1 is a cross-sectional view of a multilayer electronic component 1 according to a first preferred embodiment of the present invention.
Figure 2:
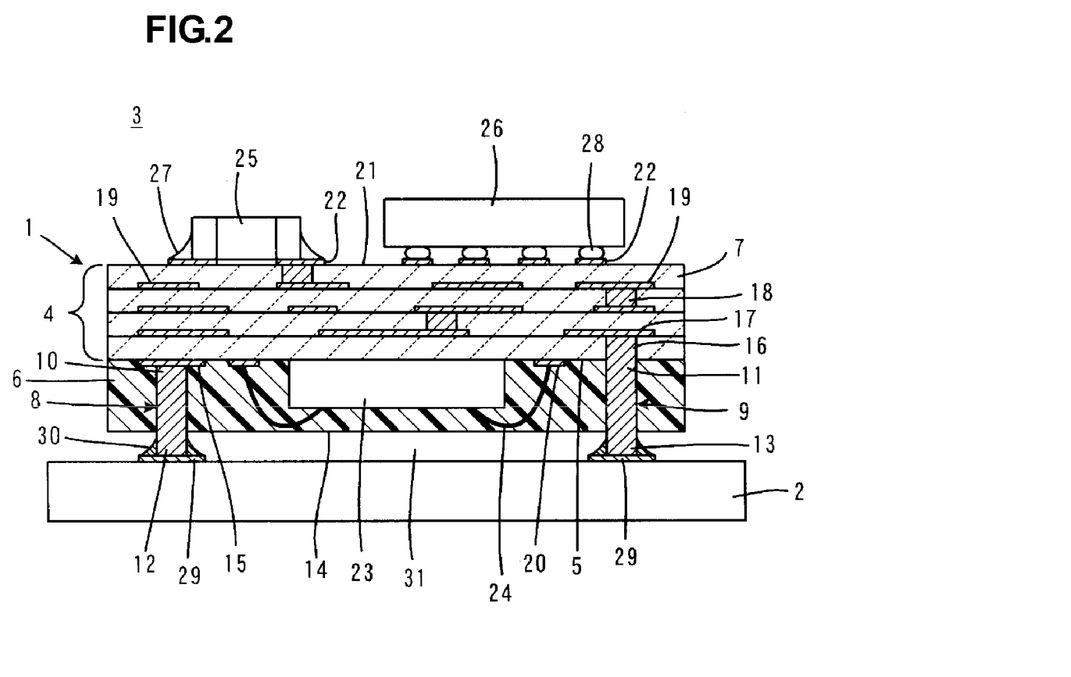
FIG. 2 is a cross-sectional view of an electronic device obtained by mounting the multilayer electronic component shown in FIG. 1 on a mounting board.
Figure 3A:
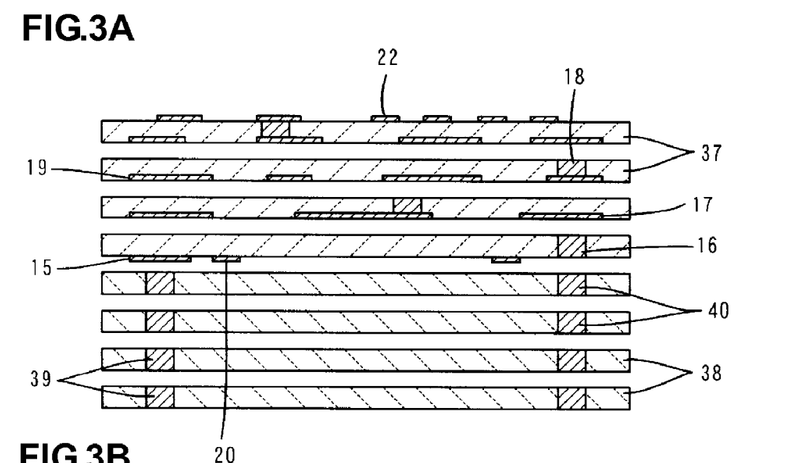
FIGS. 3A-3C illustrate a method for producing the multilayer electronic component shown in FIG. 1 and, in particular, steps of forming a structure including a ceramic substrate and columnar conductors.
Figure 3B:
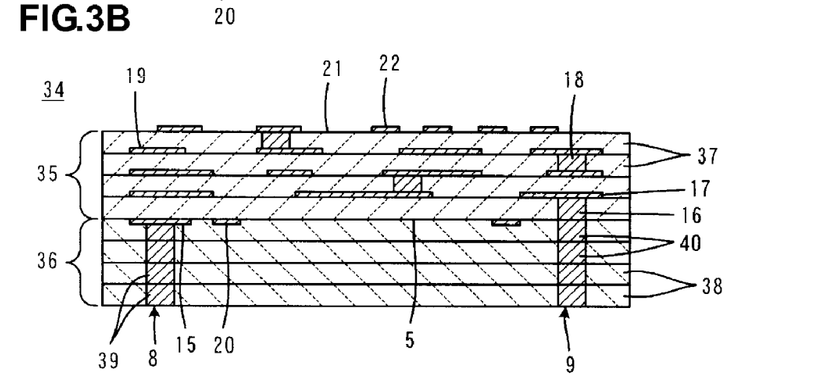
Figure 3C:
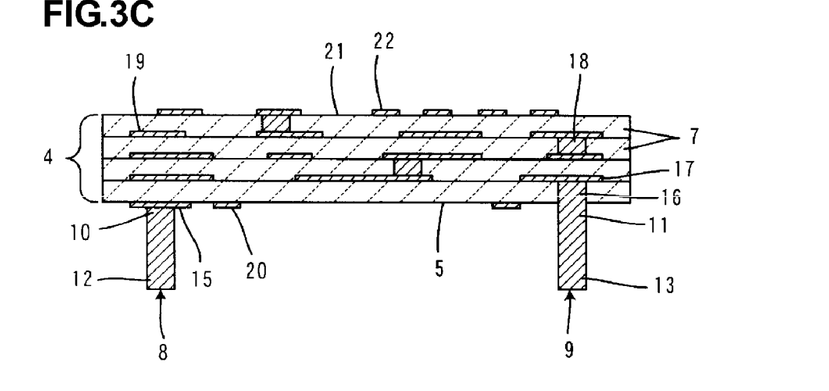

FIGS. 1 to 3C each illustrate a first preferred embodiment of the present invention. FIG. 1 is a cross-sectional view of a multilayer electronic component 1. FIG. 2 is a cross-sectional view of an electronic device 3 obtained by mounting the multilayer electronic component 1 shown in FIG. 1 on a mounting board 2. FIGS. 3A-3C are a cross-sectional views illustrating a method for producing the multilayer electronic component 1.

Referring to FIG. 1, the multilayer electronic component 1 includes a ceramic substrate 4 and a resin layer 6 disposed on one main surface 5 of the ceramic substrate 4. The ceramic substrate 4 has a structure in which a plurality of ceramic layers 7 are laminated. Each ceramic layer 7 is preferably composed of a low-temperature-sinterable ceramic material that will be specifically described below. The ceramic substrate 4 may be a single layer. On the other hand, the resin layer 6 is preferably composed of, for example, an epoxy resin. For example, the ceramic substrate 4 has a size of approximately 105 mm×105 mm.

Columnar conductors 8 and 9 are disposed in the resin layer 6, the axial direction of each of the columnar conductors 8 and 9 lies in the thickness direction of the resin layer 6. First ends 10 and 11 of the columnar conductors 8 and 9, respectively, in each axial direction extend to at least the interface between the ceramic substrate 4 and the resin layer 6, i.e., reach the one main surface 5 of the ceramic substrate 4. Furthermore, second ends 12 and 13 opposite the first ends 10 and 11 of the columnar conductors 8 and 9 protrude from a main surface 14 of the resin layer 6 facing the outside. The protrusion height of each of the second ends 12 and 13 from the main surface 14 is preferably about 0.01 mm or more. This is because the stress-relieving effect of the second ends 12 and 13 of the columnar conductors 8 and 9 is reliably exerted.

More specifically, the first end 10 of the columnar conductor 8 is positioned on the one main surface 5 of the ceramic substrate 4 and integrated with a surface conductive film 15 disposed on the main surface 5. The columnar conductor 9 is formed such that the first end 11 reaches the inside of the ceramic substrate 4. The columnar conductor 9 is integrated with a via conductor 16 passing through the ceramic layer 7 in the thickness direction and with an internal conductive film 17 disposed along the interface between the ceramic layers 7. The structure of the columnar conductor 9 shows high mechanical strength, in particular, high shear strength compared with the columnar conductor 8. In this preferred embodiment, the columnar conductor 8 and the columnar conductor 9, which are different from each other, are provided. Alternatively, a plurality of columnar conductors having either structure may be disposed.

The ceramic substrate 4 includes some via conductors 18 and some internal conductive films 19 in addition to the via conductor 16 and the internal conductive film 17. Furthermore, some surface conductive films 20 are disposed on the main surface 5 of the ceramic substrate 4 in addition to the surface conductive film 15. Moreover, some external conductive films 22 are disposed on a main surface 21 opposite the one main surface 5 of the ceramic substrate 4, i.e., on the main surface 21 facing the outside.

The columnar conductors 8 and 9, the surface conductive films 15, 17, 19, 20, and 22, and the via conductors 16 and 18 are each preferably composed of a sintered metal mainly containing, for example, Ag. The details of the material of, for example, the columnar conductors 8 and 9 and another example will be described below in the description of production method. When the columnar conductors 8 and 9 are each preferably composed of a sintered Ag metal, the stress-relieving effect is increased because of the satisfactory ductility of Ag. Furthermore, when the columnar conductors 8 and 9 are each composed of Ag, properties, such as low resistivity, satisfactory heat-releasing properties, and satisfactory solderability, of Ag are reflected in the columnar conductors 8 and 9.

Each of the columnar conductors 8 and 9 preferably has a substantially square cross section and a size of approximately 0.5 mm×0.5 mm in cross section. Alternatively, the cross section of each of the columnar conductors 8 and 9 may be changed to, for example, a rectangle, a polygon other than a quadrangle, a circle, or an oval.

The multilayer electronic component 1 includes an electronic subcomponent 23 mounted on the main surface 5 of the ceramic substrate 4 and incorporated in the resin layer 6. The electronic subcomponent 23 is a semiconductor element, such as an IC chip. The electronic subcomponent 23 is electrically connected to the surface conductive films 20 with bonding wires 24. On the other hand, electronic subcomponents 25 and 26 are mounted on the main surface 21 of the ceramic substrate 4 facing the outside. The electronic subcomponent 25 is a chip subcomponent, such as a multilayer ceramic capacitor. The electronic subcomponent 25 is electrically connected to the external conductive films 22 with solder 27. The electronic subcomponent 26 is a semiconductor element, such as an IC chip. The electronic subcomponent 26 is electrically connected to the external conductive films 22 with bumps 28.

FIG. 2 shows the mounting board 2. Conductive lands 29 are disposed on the mounting board 2 and function as conductive connecting portions. For example, the mounting board 2 is a printed circuit board. The conductive lands 29 are each formed of Cu foil. The columnar conductors 8 and 9 are electrically connected to the conductive lands 29 with solder 30. According to need, the exposed second ends 12 and 13 of the columnar conductors 8 and 9 may be subjected to Ni plating or Au plating. Furthermore, another conductive connecting member such as a conductive adhesive may be used in place of the solder 30.

As shown in FIG. 2, when the multilayer electronic component 1 is mounted on the mounting board 2, the protrusion of the second ends 12 and 13 of the columnar conductors 8 and 9 from the main surface 14 of the resin layer 6 facing the outside results in the formation of a predetermined gap 31 between the multilayer electronic component 1 and the mounting board 2. Thus, when deformation, such as deflection and strain, occurs in the mounting board 2, a stress on the multilayer electronic component 1 is relieved.

Furthermore, filets formed of the solder 30 that electrically connect the second ends 12 and 13 of the columnar conductors 8 and 9 to the conductive lands 29 of the mounting board 2 are easily checked. The application of a sufficient amount of the solder 30 along the second ends 12 and 13 of the columnar conductors 8 and 9 sufficiently increases tensile strength and shear strength of the mounting structure in which the multilayer electronic component 1 is mounted on the mounting board 2.

The multilayer electronic component 1 shown in FIG. 1 is produced as described below.

To produce the multilayer electronic component 1, a green composite laminate 34 shown in FIG. 3B is produced. The green composite laminate 34 includes a green ceramic compact 35 and a nonsinterable inorganic material compact 36. The ceramic compact 35 is to be formed into the ceramic substrate 4. The ceramic compact 35 includes the conductive films 15, 17, 19, 20, and 22 and via conductors 16 and 18 composed of a green conductive paste. Conductive portions formed of the surface conductive film 15 and the via conductor 16 are positioned at a predetermined portions on the one main surface 5 of the ceramic compact 35.

To obtain the green composite laminate 34 described above, as shown in FIG. 3A, a plurality of ceramic green sheets 37 to be formed into the ceramic compact 35 and a plurality of inorganic material green sheets 38 to be formed into the inorganic material compact 36 are prepared.

The ceramic green sheets 37 may be produced by adding a binder, a plasticizer, a solvent, and a dispersant to a ceramic powder, mixing the mixture with a ball mill or an attractor to form a slurry, defoaming the slurry, and forming the slurry into sheets by a doctor blade method or the like.

Examples of the ceramic powder that can be used include crystallized glass powders, such as $CaO$—$Al_2O_3$—$SiO_2$ glass powders and $MgO$—$Al_2O_3$—$SiO_2$ glass powders; and a mixture of a material glass powder to be the crystallized glass and a ceramic filler, such as alumina, zircon, mullite, cordierite, anorthite, or silica.

Examples of the binder that can be used include polyvinyl butyral, methacrylic polymers, and acrylic polymers. Examples of the plasticizer that can be used include derivatives of phthalic acid. Examples of the solvent that can be used include alcohols, ketones, and chlorinated organic solvents. Examples of the dispersant that can be used include polyoxyethylenes, polyoxyalkylene glycols, and polyvinyls.

The inorganic material green sheets 38 to be formed into the inorganic material compact 36 is produced by substantially the same method as the ceramic green sheets 37. Each of the inorganic material green sheets 38 contains an inorganic material powder that is not sintered at the sintering temperature of the ceramic green sheets 37. That is, the inorganic material powder has a sintering temperature higher than that of the ceramic green sheets 37. Examples of the inorganic material powder contained in the inorganic material green sheets 38 include powders of alumina, zirconia, aluminum nitride, boron nitride, mullite, magnesium oxide, and silicon carbide.

As shown in FIG. 3A, the conductive films 15, 17, 19, 20, and 22 are formed by printing the conductive paste on specified ceramic green sheets 37. The via conductors 16 and 18 are formed in specified ceramic green sheets 37 and formed by, for example, forming through holes by irradiation of laser light and filling the through holes with the conductive paste.

Via conductors 39 and 40 to be formed into the columnar conductors 8 and 9, respectively, are formed in each inorganic material green sheet 38 and formed by, for example, forming through holes by irradiation of laser light and filling the through holes with a conductive paste. The conductive paste for forming the via conductors 39 and 40 preferably includes the same main component as that of the conductive paste for forming the surface conductive film 15 and the via conductor 16. More preferably, the conductive paste for forming the via conductors 39 and 40 preferably has the same composition as that of the conductive paste for forming the surface conductive film 15 and the via conductor 16. The use of the conductive paste increases the bonding strength between the columnar conductor 8 and the surface conductive film 15 and between the columnar conductor 9 and the via conductor 16, thus further increasing the mechanical strength of the columnar conductors 8 and 9 at the interface between the ceramic substrate 4 and the resin layer 6.

The conductive paste for forming the via conductors 39 and 40 to be formed into the columnar conductors 8 and 9 includes a metal powder, a binder, and a solvent. An Ag powder can be advantageously used as the metal powder. Another metal powder composed of, for example, Cu, Au, Ag—Pd, or Ag—Pt may be used.

To produce the green composite laminate 34 shown in FIG. 3B, in the ceramic green sheets 37 and the inorganic material green sheets 38 shown in FIG. 3A, the sheets may be successively laminated from the sheet positioned at an end in the stacking direction. Alternatively, the ceramic green sheets 37 are laminated to form the ceramic compact 35, the inorganic material green sheets 38 are laminated to form the inorganic material compact 36, and then the ceramic compact 35 may be laminated with the inorganic material compact 36.

The green composite laminate 34 is fired at a temperature at which the ceramic compact 35 is sintered but the inorganic material compact 36 is not sintered, e.g., about 870° C. Thereby, the ceramic compact 35 is formed into the ceramic substrate 4. In contrast, the inorganic material compact 36 remains green.

Next, the non-sinterable inorganic material compact 36 is removed from the fired composite laminate 34. The inorganic material compact 36 remains green after firing and thus is easily removed. The removal of the inorganic material compact 36 results in the ceramic substrate 4 including the columnar conductors 8 and 9 that protrude from the one main surface 5, as shown in FIG. 3C.

The number of columnar conductors 8 and 9 is not limited to two. At least when the multilayer electronic component 1 is mounted on the mounting board 2, the columnar conductors are formed at positions such that a mechanically and electrically stable connection between the multilayer electronic component 1 and the mounting board 2 is ensured, and the number of columnar conductors required for the stable connection may be used. For example, preferably, the columnar conductors are formed along the perimeter of the ceramic substrate 4 such that the electronic subcomponent 23 is surrounded by the columnar conductors.

As shown in FIG. 1, after the electronic subcomponent 23 is mounted on the one main surface 5 of the ceramic substrate 4, the resin layer 6 is formed such that the ends of the columnar conductors 8 and 9 protrude. The resin layer 6 is preferably formed by transfer molding. In transfer molding, the surface of the resin layer 6 is formed along the shape of a die and thus is easily flattened. If this advantage is not intended, the resin layer 6 may be formed by a dispenser method.

Next, the electronic subcomponents 25 and 26 are mounted on the main surface 21 of the ceramic substrate 4 facing the outside. Thereby, the multilayer electronic component 1 shown in FIG. 1 is obtained.

In the above-described preferred embodiment, the columnar conductors 8 and 9 protrude from the one main surface 5 of the ceramic substrate 4. However, the columnar conductors 8 and 9 may also protrude from the main surface 21 of the ceramic substrate 4. In this case, the electronic subcomponent 23 (not shown) may be further mounted on the main surface 21 of the ceramic substrate 4. The resin layer 6 may be further formed on the main surface 21 of the ceramic substrate 4.

Figure 4A:
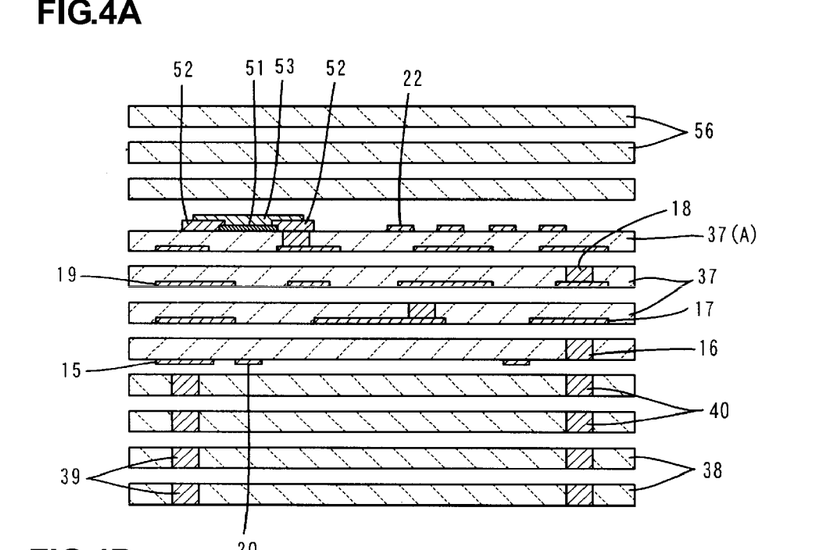
FIGS. 4A-4C are explanatory drawings illustrating a second preferred embodiment of the present invention, the drawings corresponding to FIGS. 3A-3C.
Figure 4B:
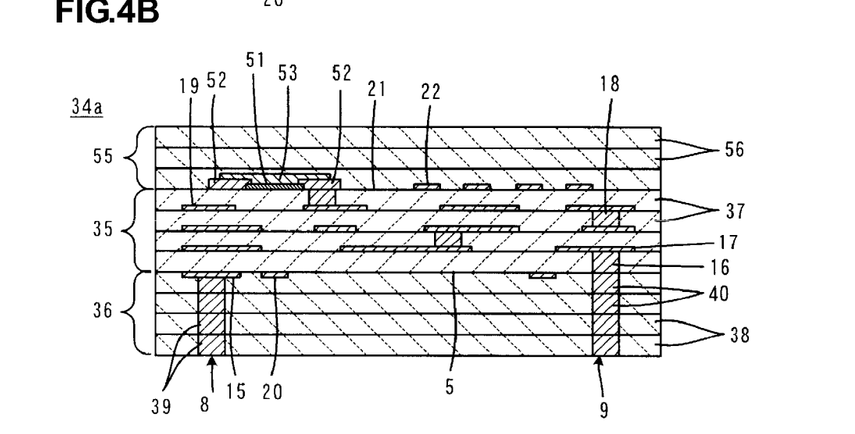
Figure 4C:
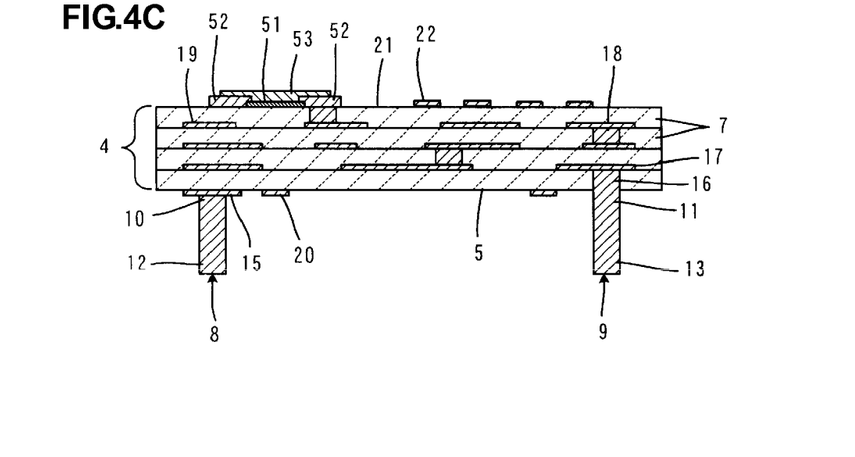

FIGS. 4A-4C are explanatory drawings illustrating a second preferred embodiment of the present invention, the drawing being corresponding to FIGS. 3A-3C. In FIGS. 4A-4C, elements equivalent to the elements shown in FIGS. 3A-3C are designated using the same reference numerals, and redundant description is not repeated.

The preferred embodiment shown in FIGS. 4A-4C is characterized in that a resistive film 51, terminating films 52, and an overcoat glass film 53 are formed on a surface of the outermost ceramic green sheet 37(A) among the plurality of ceramic green sheets 37.

The resistive film 51 is formed by, for example, applying a resistive paste containing a $RuO_2$ powder, a glass powder, and a ceramic powder. The overcoat glass film 53 is formed by, for example, applying a glass paste containing a borosilicate glass. The terminating films 52 are formed with the same conductive paste as that for forming the surface conductive film 15 and the like.

The resistive paste may be applied to at least one of the ceramic green sheets 37 other than the outermost sheet to form a resistive film incorporated in the ceramic substrate 4 (not shown).

As shown in FIG. 4B, this preferred embodiment is characterized in that the inorganic material compact 36 is disposed on the one main surface 5 of the ceramic compact 35, and an inorganic material compact 55 is disposed on the other main surface 21 of the ceramic compact 35. As shown in FIG. 4A, the inorganic material compact 55 is formed by stacking a plurality of inorganic material green sheets 56. Each of the inorganic material green sheets 56 has substantially the same composition as the inorganic material green sheets 38 described above.

In this preferred embodiment, as shown in FIG. 4B, a composite laminate 34a including the ceramic compact 35 interposed between the inorganic material compacts 36 and 55 is fired. In this case, the ceramic compact 35 is sintered. However, both of the inorganic material compacts 36 and 55 are not sintered. Thus, the inorganic material compacts 36 and 55 suppress the shrinkage of the ceramic compact 35 in the direction of the main surface and effectively suppress the occurrence of warpage of the ceramic compact 35 during firing.

Thicknesses of the inorganic material compacts 36 and 55 may be the same or different as shown in the figure. That is, in view of the degree of warpage that can occur in the ceramic compact 35 during firing, the thicknesses of the inorganic material compacts 36 and 55 may be adjusted.

Figure 5:
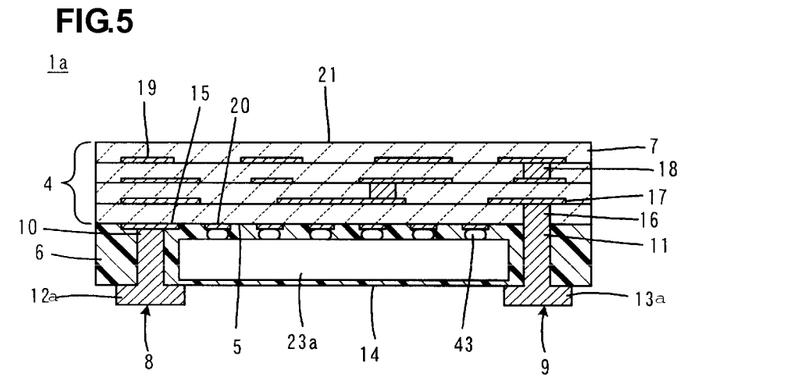
FIG. 5 is a cross-sectional view of a multilayer electronic component according to a third preferred embodiment of the present invention.
Figure 6:
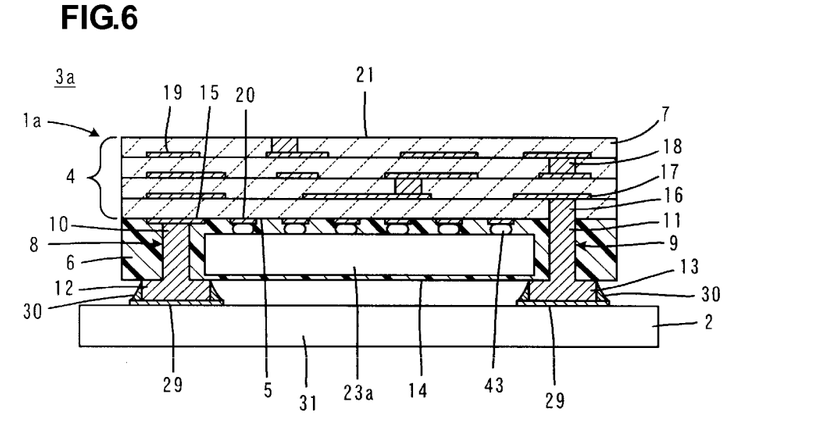
FIG. 6 is a cross-sectional view of an electronic device obtained by mounting the multilayer electronic component shown in FIG. 5 on the mounting board.
Figure 7:
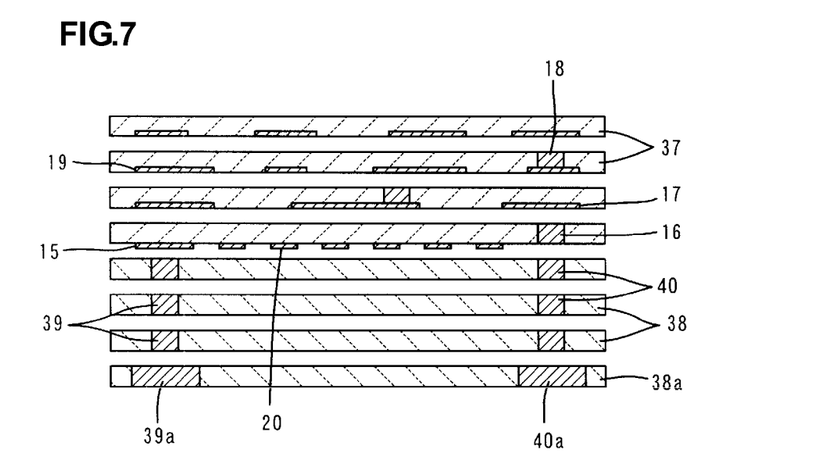
FIG. 7 is an explanatory drawing illustrating a method for producing the multilayer electronic component shown in FIG. 5, the drawing corresponding to FIG. 3A.

FIGS. 5 to 7 illustrate a third preferred embodiment of the present invention. FIG. 5 corresponds to FIG. 1. FIG. 6 corresponds to FIG. 2. FIG. 7 corresponds to FIG. 3A. In FIGS. 5 to 7, elements equivalent to the elements shown in FIGS. 1 to 3 are designated using the same reference numerals, and redundant description is not repeated.

A multilayer electronic component 1a shown in FIG. 5 is characterized in that second ends 12a and 13a of the columnar conductors 8 and 9 each have a cross-sectional area larger than that of the intermediate portion of a corresponding one of the columnar conductors 8 and 9 in the axial direction. In the multilayer electronic component 1a, an electronic subcomponent 23a mounted on the one main surface 5 of the ceramic substrate 4 and incorporated in the resin layer 6 is electrically connected to the surface conductive films 20 with bumps 43. The electronic subcomponent 23a has a mounting area larger than that of the electronic subcomponent 23 shown in FIG. 1.

Of course, in this preferred embodiment, an electronic subcomponent having a small mounting area may be incorporated. Furthermore, an electronic subcomponent electrically connected to the surface conductive films 20 with bonding wires may be incorporated.

In the multilayer electronic component 1a shown in FIG. 5, an electronic subcomponent is not mounted on the main surface 21 of the ceramic substrate 4 facing the outside. However, this is not an essential feature in the third preferred embodiment. Thus, also in the multilayer electronic component 1a shown in FIG. 5, an electronic subcomponent may be mounted on the main surface 21 of the ceramic substrate 4 facing the outside. Furthermore, a resistor and the like may be formed thereon.

In the multilayer electronic component 1a according to the third preferred embodiment, as shown in FIG. 6, an electronic device 3a is obtained while the mounting area for the electronic subcomponent 23a incorporated is ensured by thinning the columnar conductors 8 and 9 in the resin layer 6. Thus, when the multilayer electronic component 1a is mounted on the mounting board 2, the contact area between each of the columnar conductors 8 and 9 and a corresponding one of the conductive lands 29 disposed on the mounting board 2 is increased to improve the reliability of the electrical connection.

A composite laminate for forming the multilayer electronic component 1a shown in FIG. 5 has a multilayer structure shown in FIG. 7. As shown in FIG. 7, in an inorganic material green sheet 38a located at the end in the stacking direction, via conductors 39a and 40a to be formed into the columnar conductors 8 and 9, respectively, each have a diameter larger than that of each of the via conductors 39 and 40 formed in other inorganic material green sheets 38. The use of the multilayer structure easily results in the columnar conductors 8 and 9 having the second ends 12a and 13a each having a cross-sectional area larger than that of a corresponding one of the intermediate portions in the axial direction. According to need, two or more inorganic material green sheets 38a including the via conductors 39a and 40a each having a larger diameter may be used.

Figure 8:
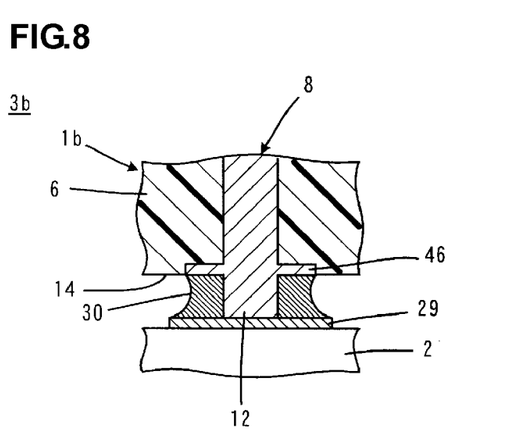
FIG. 8 is a partially enlarged cross-sectional view of an electronic device including a multilayer electronic component according to a fourth preferred embodiment of the present invention.
Figure 9:
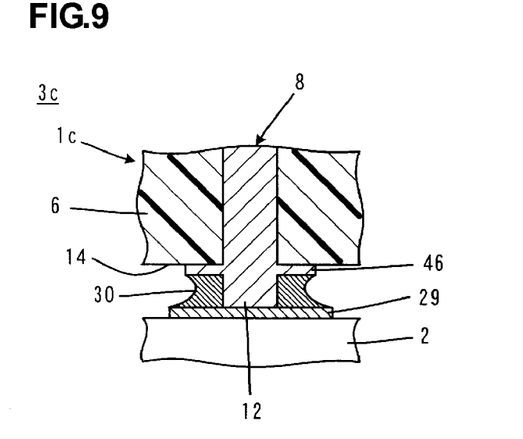
FIG. 9 is a partially enlarged cross-sectional view of an electronic device including a multilayer electronic component according to a fifth preferred embodiment of the present invention.
Figure 10:
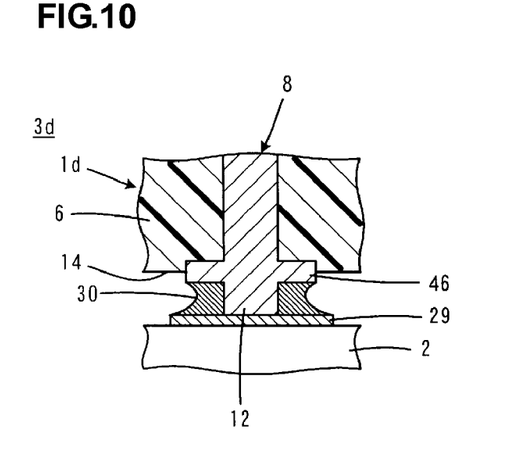
FIG. 10 is a partially enlarged cross-sectional view of an electronic device including a multilayer electronic component according to sixth preferred embodiment of the present invention.

FIGS. 8 to 10 illustrate fourth to sixth preferred embodiments of the present invention and each a partially enlarged cross-sectional view of an electronic device including a multilayer electronic component mounted on a mounting board. In FIGS. 8 to 10, elements equivalent to the elements shown in FIG. 2 are designated using the same reference numerals, and redundant description is not repeated.

FIGS. 8 to 10 show the columnar conductor 8 and a structure associated with the columnar conductor 8. The columnar conductor 9 and a structure associated with the columnar conductor 9 are preferably substantially identical to the columnar conductor 8 and the structure. Thus, a figure showing the columnar conductor 9 and the structure and description thereof are omitted.

Multilayer electronic components 1b to 1d included in electronic devices 3b to 3d shown in FIGS. 8 to 10 are each characterized in that the columnar conductor 8 has a flange portion 46 at the intermediate portion in the axial direction, the flange portion 46 having a cross-sectional area larger than that of the second end 12. The flange portion 46 is located so as to be in contact with the main surface 14 of the resin layer 6 facing the outside.

More specifically, in the multilayer electronic component 1b shown in FIG. 8, the surface of the flange portion 46 facing the outside is flush with the main surface 14 of the resin layer 6 facing the outside. In the multilayer electronic component 1c shown in FIG. 9, the surface of the flange portion 46 facing the inside is flush with the main surface 14 of the resin layer 6 facing the outside. In the multilayer electronic component 1d shown in FIG. 10, the main surface 14 of the resin layer 6 facing the outside is in contact with the middle portion of the flange portion 46 in the thickness direction.

FIGS. 8 to 10 each show the solder 30 connecting the second end 12 of the columnar conductor 8 to a corresponding one of the conductive lands 29 on the mounting board 2. As described above, the formation of the flange portion 46 in the columnar conductor 8 allows a solder fillet formed of the solder 30 to thicken at both ends in the axial direction. Thus, the electrical connection between the columnar conductor 8 and the corresponding conductive land 29 is achieved with high reliability.

To form the columnar conductor 8 having the flange portion 46 as shown in each of FIGS. 8 to 10, substantially the same method as that described with reference to FIG. 7 may be used. In this case, an inorganic material green sheet including a via conductor, to be formed into the flange portion 46, having a relatively large diameter may be interposed at the intermediate portion of a multilayer structure including a plurality of inorganic material green sheets. According to need, two or more inorganic material green sheets each including the via conductor having a relatively large diameter may be used.

Figure 11:
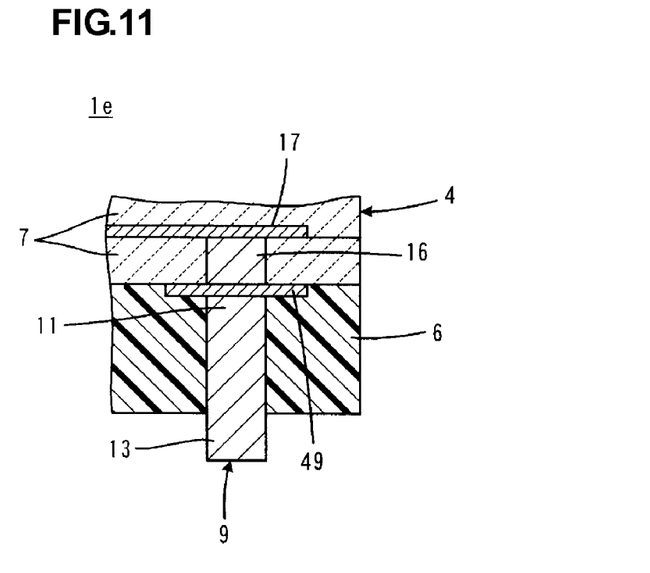
FIG. 11 is a partially enlarged cross-sectional view of a multilayer electronic component according to a seventh preferred embodiment of the present invention.

FIG. 11 illustrates a seventh preferred embodiment of the present invention and is an enlarged view of a portion corresponding to a portion in FIG. 1, more specifically, the portion corresponding to the portion at which the columnar conductor 9 is disposed. In FIG. 11, elements equivalent to the elements shown in FIG. 1 are designated using the same reference numerals, and redundant description is not repeated.

A multilayer electronic component 1e shown in FIG. 11 is characterized in that a pad electrode 49 is formed between the columnar conductor 9 and the via conductor 16 that are integrated by sintering. The pad electrode 49 is formed by the same method as that for forming the surface conductive film 15 (see FIG. 1) and the like. The pad electrode 49 has a relatively wide area. Thus, even when the columnar conductor 9 and the via conductor 16 are misaligned, the pad electrode 49 acts so as to ensure the electrical connection between them. Furthermore, the pad electrode 49 increases the interface between the ceramic substrate 4 and the resin layer 6. As a result, the pad electrode 49 acts so as to improve the strength, in particular, strength to withstand a drop test and shear strength, of the multilayer electronic component 1e.

Figure 12:
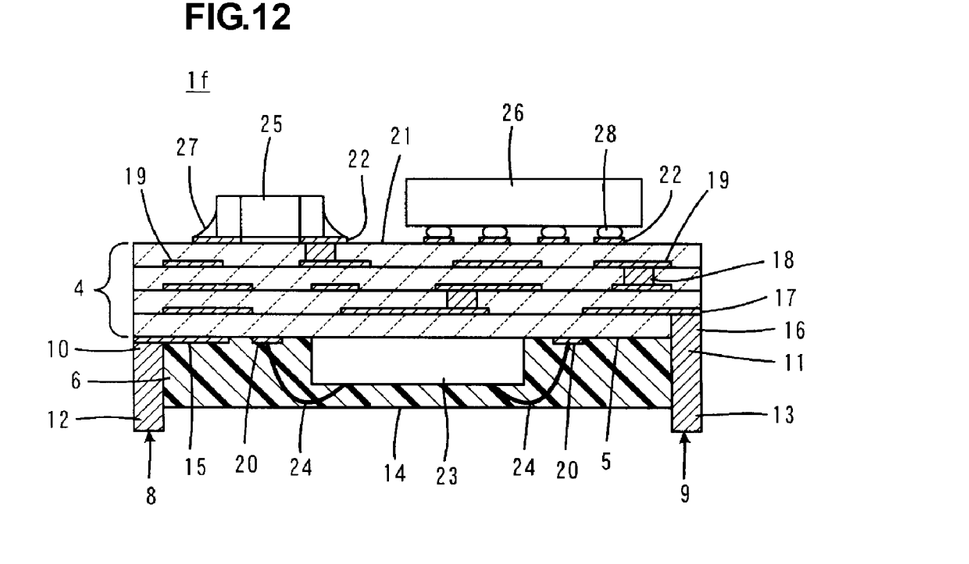
FIG. 12 is a cross-sectional view of a multilayer electronic component according to an eighth preferred embodiment of the present invention.

FIG. 12 illustrates an eighth preferred embodiment of the present invention and corresponds to FIG. 1. In FIG. 12, elements equivalent to the elements shown in FIG. 1 are designated using the same reference numerals, and redundant description is not repeated.

A multilayer electronic component 1f shown in FIG. 12 is characterized in that the columnar conductors 8 and 9 are disposed while side surfaces thereof are exposed. According to the columnar conductors 8 and 9 having the structure, in a mounting state of the multilayer electronic component 1f as shown in FIG. 2, the area to which the solder 30 for connecting the columnar conductors 8 and 9 to the conductive lands 29 is applied is increased to improve the reliability of soldering.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A multilayer electronic component comprising:
   a ceramic substrate; and
   a resin layer disposed on one main surface of the ceramic substrate, the resin layer including a main surface arranged to face toward an outside of the multilayer electronic component; wherein
   the ceramic substrate includes a surface conductive film positioned at at least one of the one main surface and a via conductor;

the resin layer includes a columnar conductor made of a sintered metal and arranged such that an axial direction of the columnar conductor lies in a thickness direction of the resin layer, a first end of the columnar conductor in the axial direction reaches at least an interface between the ceramic substrate and the resin layer, the first end of the columnar conductor is integrated with at least one of the surface conductive film and the via conductor provided in the ceramic substrate, and a second end of the columnar conductor opposite to the first end of the columnar conductor protrudes from the main surface of the resin layer such that the second end of the columnar conductor is spaced from the main surface of the resin layer in an axial direction of the columnar conductor.

2. The multilayer electronic component according to claim 1, wherein the columnar conductor has a flange portion at an intermediate portion of the columnar conductor in the axial direction, and the flange portion has a cross-sectional area larger than that of the second end and is located so as to be in contact with the main surface of the resin layer.

3. The multilayer electronic component according to claim 1, wherein the second end of the columnar conductor has a cross-sectional area larger than that of an intermediate portion of the columnar conductor in the axial direction.

4. The multilayer electronic component according to claim 1, wherein the second end of the columnar conductor protrudes from the main surface of the resin layer facing the outside and has a protrusion height of about 0.01 mm or more.

5. The multilayer electronic component according to claim 1, further comprising an electronic subcomponent mounted on the ceramic substrate and incorporated in the resin layer.

6. The multilayer electronic component according to claim 1, further comprising an electronic subcomponent mounted on a main surface of the ceramic substrate facing the outside.

7. An electronic device comprising:
   the multilayer electronic component according to claim 1; and
   a mounting board upon which the multilayer electronic component is mounted; wherein
   the multilayer electronic component is arranged such that the main surface of the resin layer facing the outside faces the mounting board;
   the second end of the columnar conductor is electrically connected to a conductive connecting portion disposed on the mounting board with a conductive connecting member; and
   a predetermined gap is provided between the multilayer electronic component and the mounting board.

8. The electronic device according to claim 7, wherein the conductive connecting member is solder.

9. The multilayer electronic component according to claim 1, wherein the first end of the columnar conductor extends into the ceramic substrate.

* * * * *